(12) United States Patent
Zhang et al.

(10) Patent No.: US 12,740,667 B2
(45) Date of Patent: Sep. 22, 2026

(54) COOKING UTENSIL

(71) Applicant: ZHEJIANG SHINTOWN INDUSTRY CO., LTD, Jinhua (CN)

(72) Inventors: Mingwei Zhang, Jinhua (CN); Yiqi Yao, Jinhua (CN); Wanjian Pu, Jinhua (CN); Jianzhong Tang, Jinhua (CN)

(73) Assignee: ZHEJIANG SHINTOWN INDUSTRY CO., LTD, Jinhua (CN)

( * ) Notice: Subject to any disclaimer, the term of this patent is extended or adjusted under 35 U.S.C. 154(b) by 0 days.

(21) Appl. No.: 19/015,915

(22) Filed: Jan. 10, 2025

(65) Prior Publication Data

US 2026/0013661 A1 Jan. 15, 2026

(30) Foreign Application Priority Data

Jul. 13, 2024 (CN) ......................... 202410938444.3

(51) Int. Cl.

*A47J 36/02* (2006.01)
*A47J 37/10* (2006.01)
*C23C 14/16* (2006.01)
*C23C 14/34* (2006.01)
*C23C 14/35* (2006.01)

(52) U.S. Cl.

CPC ............. *A47J 36/025* (2013.01); *A47J 37/10* (2013.01); *C23C 14/16* (2013.01); *C23C 14/3407* (2013.01); *C23C 14/35* (2013.01)

(58) Field of Classification Search

CPC ..... A47J 36/025; A47J 37/10; C23C 14/0652; C23C 14/16; C23C 10/32; C22C 27/06
USPC ...................................... 204/298.13; 420/428
See application file for complete search history.

(56) References Cited

U.S. PATENT DOCUMENTS 5,440,973 A 8/1995 Welhouse
5,447,803 A 9/1995 Nagaoka et al.
5,628,426 A * 5/1997 Doyle .................. A47J 27/022 99/425
6,197,438 B1 3/2001 Faulkner
2008/0105689 A1* 5/2008 Ren ...................... A47J 27/002 220/573.2
2020/0240002 A1* 7/2020 Zimmer ........... H01J 37/32614

FOREIGN PATENT DOCUMENTS

CN 102987905 A 3/2013
CN 103082849 A 5/2013
CN 103859999 A 6/2014
CN 204580879 U 8/2015

(Continued)

OTHER PUBLICATIONS

CN_108968700_translation.pdf (Year: 2018).*

(Continued)

*Primary Examiner* — Allan D Stevens
(74) *Attorney, Agent, or Firm* — Cooper Legal Group, LLC

(57) ABSTRACT

The present application provides a cooking utensil, including a body, a plurality of protrusions are integrally formed on at least a partial area of an inner surface of the body, the protrusions are higher than the inner surface, and gaps between the protrusions are communicated with each other, a physical vapor deposition layer is provided on a surface of each of the protrusions. The cooking utensil of the present application has good non-stick performance and non-discoloration performance when cooking food.

3 Claims, 13 Drawing Sheets

(56) References Cited

FOREIGN PATENT DOCUMENTS

| | | | | | |
|---|---|---|---|---|---|
| CN | 107495826 | A | | 12/2017 | |
| CN | 206950017 | U | | 2/2018 | |
| CN | 108968700 | A | * | 12/2018 | ............. A47J 36/04 |
| CN | 208658924 | U | | 3/2019 | |
| CN | 210493769 | U | | 5/2020 | |
| CN | 117230434 | A | | 12/2023 | |
| CN | 117359238 | A | | 1/2024 | |
| CN | 220778123 | U | | 4/2024 | |
| CN | 220832722 | U | | 4/2024 | |
| CN | 116024571 | B | | 6/2024 | |
| CN | 118141247 | A | | 6/2024 | |
| CN | 118207507 | A | * | 6/2024 | ........... A47J 36/025 |
| EP | 3622864 | A1 | | 3/2020 | |
| JP | S4911746 | Y1 | | 3/1974 | |
| JP | H04329860 | A | | 11/1992 | |
| JP | 3077070 | U | | 5/2001 | |
| JP | 2003210335 | A | | 7/2003 | |
| JP | 2017531472 | A | | 10/2017 | |
| JP | 2019507651 | A | | 3/2019 | |
| JP | 2023136920 | A | | 9/2023 | |
| KR | 101392095 | B1 | | 5/2014 | |

OTHER PUBLICATIONS

CN_118207507_translation.pdf (Year: 2024).*

First Office Action received in corresponding Japanese patent application No. 2025-005823, dated Feb. 4, 2025, 12 pages.

Second Office Action received in corresponding Japanese patent application No. 2025-005823, dated Apr. 15, 2025, 10 pages.

European Search Report received in corresponding European patent application No. 25151828.8, dated Jun. 25, 2025, 5 pages.

Mikriukova, M., et al., "Permeation of vegetable oils and slippery properties of extrusion coated paperboard", Packaging Technology and Science, 2022, pp. 1-14.

* cited by examiner

COOKING UTENSIL

CROSS-REFERENCE TO RELATED APPLICATION

The present application is based on and claims the priority benefits of China application No. 202410938444.3, filed on Jul. 13, 2024. The entirety of China application No. 202410938444.3 is hereby incorporated by reference herein and made a part of this specification

TECHNICAL FIELD

The present application relates to a technical field of cooking utensils, and in particular, relates to a cooking utensil with a hydrophobic surface.

BACKGROUND ART

With the continuous advancement of technology, requirements of people for cooking utensils are also increasing, people not only pursue cooking effects, but also pay attention to the ease of cleaning, durability, and health of utensils. In this context, a non-stick pan, as cooking utensils with special surface treatments, are widely welcomed for their ability to effectively prevent food adhesion and reduce the use of oil during cooking. In order to achieve non-stick performance of cooking utensils, a layer of polytetrafluoroethylene is usually coated on a surface of the cooking utensils, a polytetrafluoroethylene coating is non-toxic under normal conditions, but the polytetrafluoroethylene coating begins to evaporate when heated to 260° C., when a temperature reaches 350° C., the polytetrafluoroethylene coating will begin to decompose, therefore, a use temperature of stainless steel cooking utensils with polytetrafluoroethylene coating should generally not exceed 250° C. However, general cooking utensils such as frying pans, a heating temperature often exceeds 260° C., which exists a safety hazard, in addition, the polytetrafluoroethylene coating is not wear-resistant and there is a risk of detachment, which can easily be ingested by food and affect physical health.

In order to solve the above problems, in recent years, researchers have begun to explore new non-stick technologies in order to improve the durability and safety of cooking utensils while ensuring non-stick effects. Prior applications of the applicant with publication number CN220778123U, patent name for a physical non-stick structure and cooking utensil, and publication number CN116024571B, patent name for a method of preparing a rust proof non-stick utensil formed by nitriding an surface of an inner pot of an air fryer disclose a concave convex structure, the concave convex structure is formed by processing concave parts on the surface of the cooking utensils through physical or chemical methods, a disadvantage of this structure is that it is not easy to clean, prone to discoloration at high temperatures, and the a consistency of non-stick performance is poor.

SUMMARY

In view of this, the present application provides a cooking utensil with advantages of easy cleaning, difficult discoloration, and stable non-stick performance.

The present application provides a cooking utensil including a body, a plurality of protrusions are integrally formed on at least a partial area of an inner surface of the body, the protrusions are higher than the inner surface, and gaps between the protrusions are communicated with each other to allow gas or liquid to flow along the inner surface within the gaps, a physical vapor deposition layer is provided on a surface of each of the protrusions.

By adopting the above technical solution, the protrusions can reduce a contact between food and the inner surface of the cooking utensil, improving non-stick performance. A structure of an integrated protrusion formed on the inner surface of the body in the present application is different from a previous pit structure, firstly, the gaps between the protrusions are communicated with each other, and there are tiny gaps between these structures. When oil or water droplets fall onto the inner surface of the cooking utensil, oil or water droplets will not directly contact the inner surface of the cooking utensil, but are supported by these tiny structures, forming spaces composed of air cushions that are communicated with each other, which facilitate air flow to isolate cooking ingredients from the inner surface of the cooking utensil. This phenomenon causes oil or water to appear spherical on a surface of the cooking utensil, making it easy to roll and thus exhibiting non-stick performance. Secondly, a combination of structure of protrusions and the physical vapor deposition layer results in the inner surface of the cooking utensil having extremely low surface energy, which can significantly reduce a contact angle between liquids such as water and oil, forming a hydrophobic effect similar to lotus leaves. This hydrophobic surface can effectively prevent food adhesion, even under a high temperature cooking condition, food is not easily adhered to the surface of the cooking utensil, thus achieving a non-stick effect. Thirdly, due to hydrophobicity of the structure of protrusions, food residues are less likely to adhere to the surface of cooking utensil, making cleaning work simpler and faster after cooking. Just rinse with clean water or gently wipe to remove food residues, which greatly saves cleaning time and effort. In addition, the gaps between the protrusions are communicated with each other, there are no blind spots in a traditional pit structure, making it easy for brushes and other tools to clean the surface of cooking utensil. Fourthly, a design of the structure of protrusions not only enhances the non-stick performance, but also optimizes a thermal conductivity performance of the cooking utensil. The gaps between the protrusions are communicated with each other, which can promote an uniform distribution of heat, avoid local overheating, and make the food more evenly heated, resulting in a better cooking effect. Compared with a traditional non-stick coating, the physical vapor deposition layer does not contain harmful substances such as PFOA (perfluorooctanoic acid), and does not release harmful gases during cooking, which is harmless to human health and meets needs of modern households for healthy cooking utensils.

In some embodiments, after each of the protrusions contacts with edible oil, there is a contact angle between the edible oil and each of the protrusions, and the contact angle is greater than or equal to 80°.

In some embodiments, the contact angle ranges from 90° to 136°, preferably the contact angle is 110°.

By adopting the above technical solution, when the contact angle between the edible oil and the protrusions is greater than or equal to 80°, the surface of each of the protrusions has high hydrophobicity. This hydrophobicity makes the edible oil form a spherical shape on the surface of each of the protrusions, which is not easy to spread, thereby reducing a contact area between the edible oil and the surface of each of the protrusions and reducing a possibility of food adhesion. Adhesion between food and the surface of the cooking utensil weakens during a cooking process, and food residues are less likely to adhere to the surface of each of the protrusions, even under the high temperature cooking condition, food is less likely to adhere, thus achieving a better non-stick effect. The surface of each of the protrusions with high contact angle can promote a sliding of food during cooking, reduce a friction between food and the surface of the cooking utensil, make food stir frying smoother, and improve cooking efficiency and effectiveness.

In some embodiments, a cross-section of each of the protrusions is a circle or a polygon.

In some embodiments, the cross-section of each of the protrusions is the circle, a diameter of each of the protrusions is 0.15-0.5 mm, and/or a distance between any two protrusions is 0.2-0.6 mm, and/or a height of each of the protrusions is 0.05-0.1 mm.

By adopting the above technical solution, a shape of the cross-section has a direct impact on a size of the contact angle. Circular or approximately circular cross-sections, as well as a polygonal cross-section, can form a smoother surface, which contributes to a formation of a larger contact angle. Protrusions with a circular cross-section, due to a smoother surface of the protrusions, can better support surface tension of liquids, causing the liquids to form the spherical shape on the surface of each of the protrusions with the larger contact angle, thereby exhibiting good non-stick performance. Protrusions with a polygonal cross-section, although the surface of the protrusions may not be as smooth as the protrusions with the circular cross-section, can capture air at corners and edges of the protrusions to form a tiny air cushion, which also helps to increase the contact angle and achieve the non-stick effect. Circular or approximately circular cross-sections can form a more uniform microstructure, which helps to optimize a distribution of the contact angle, making the non-stick performance of the surface of an entire cooking utensil more uniform. Protrusions with the polygonal cross-section, through a unique geometric shape, can form a more complex structure at a micro level, further enhancing non-stick performance.

In some embodiments, an end face of each of the protrusions departing from the inner surface of the body is a curved surface and/or a flat surface.

In some embodiments, a longitudinal section of each of the protrusions is a polygon, and an angle between the end face and a side wall of each of the protrusions is an obtuse angle.

By adopting the above technical solution, a shape of the end face of each of the protrusions has a direct impact on the size of the contact angle. A design of the curved surface can form a relatively smooth surface, which helps to form the larger contact angle and better support the surface tension of liquids, allowing the liquids to form the spherical shape on the surface of each of the protrusions, thereby exhibiting good non-stick performance. A flat combination design with the obtuse angle between the end face and the side wall of each of the protrusions can still maintain a relatively high contact angle overall.

In some embodiments, the physical vapor deposition layer is a physical vapor deposition (PVD) coating formed by depositing a PVD target material composed of 10-30% silicon by mass percentage and a balance of metal on the surface of each of the protrusions through PVD process, the metal comprises one or more selected from a group consisting of chromium, zirconium, or titanium.

By adopting the above technical solution, the PVD target material provided in the present application can form a composite film on a surface of metal substrates after physical vapor deposition, the composite film consists of metals, silicon, metal nitrides, silicon nitride, and metal silicides. By combining materials of different particle sizes, the composite film ensures a tight bond, effectively isolating air and avoiding gaps that may occur when using single-element target material to form the PVD coating, therefore, the PVD coating formed by the PVD target material provided in the present application can enhance surface hardness of metal substrates, ensure that the PVD coating does not change color when heated, and has good non-stick performance, and a surface is easy to clean.

In some embodiments, the PVD target material is composed of 15-20% silicon by mass percentage and a balance of chromium; or the PVD target material is composed of 15-20% silicon by mass percentage and a balance of metal, the metal is chromium and titanium; or the PVD target material is composed of 15-20% silicon by mass percentage and a balance of metal, the metal is chromium, zirconium, and titanium.

By adopting the above technical solution, it is possible to ensure that a cost of the PVD target material is low while maintaining good non-stick performance in the PVD coating formed by the PVD target material, additionally, it can prevent the PVD coating from discoloring when heated. By utilizing the PVD target material composed of silicon, chromium, and titanium, it is possible to ensure that the PVD coating formed using the PVD target material has a high level of hardness.

In some embodiments, the PVD target material is composed of 15-20% silicon by mass percentage and a balance of metal, the metal is chromium and titanium, and a content of titanium is 0.001-3 wt % based on a total weight of the metal.

By limiting the content of titanium element, it is possible to control the cost of the PVD target material while ensuring that the PVD coating formed using the PVD target material has a high hardness, avoiding a decrease in hardness caused by low titanium content, and also avoiding a problem of cost not being proportional to an increase in hardness caused by an increase in titanium content.

In summary, the present application has at least one of the following beneficial technical effects.

1. The structure of the integrated protrusion formed on the inner surface of the body in the present application is different from the previous pit structure, the gaps between the protrusions are communicated with each other and have good hydrophobicity, oil or water droplets will not directly contact the inner surface of the cooking utensil, but are supported by these tiny structures, forming spaces composed of air cushions that are communicated with each other, which facilitate air flow to isolate cooking ingredients from the inner surface of the cooking utensil. It can achieve good non-stick performance and is easy to clean.
2. The PVD target material provided in the present application is composed of 10-30% silicon and the balance of metal, the metal includes one or more selected from the group consisting of chromium, zirconium, or titanium, the PVD target material provided in the present application can form the composite film on the surface of metal substrates after physical vapor deposition, the composite film consists of metals, silicon, metal nitrides, silicon nitride, and metal silicides. By combining materials of different particle sizes, the composite film ensures the tight bond, effectively isolating air and avoiding gaps that may occur when using single-element target material to form the PVD coating, therefore, the PVD coating formed by the PVD target material provided in the present application can enhance surface hardness of metal substrates, ensure that the PVD coating does not change color when heated, and has good non-stick performance, and the surface is easy to clean.

Figure 1:
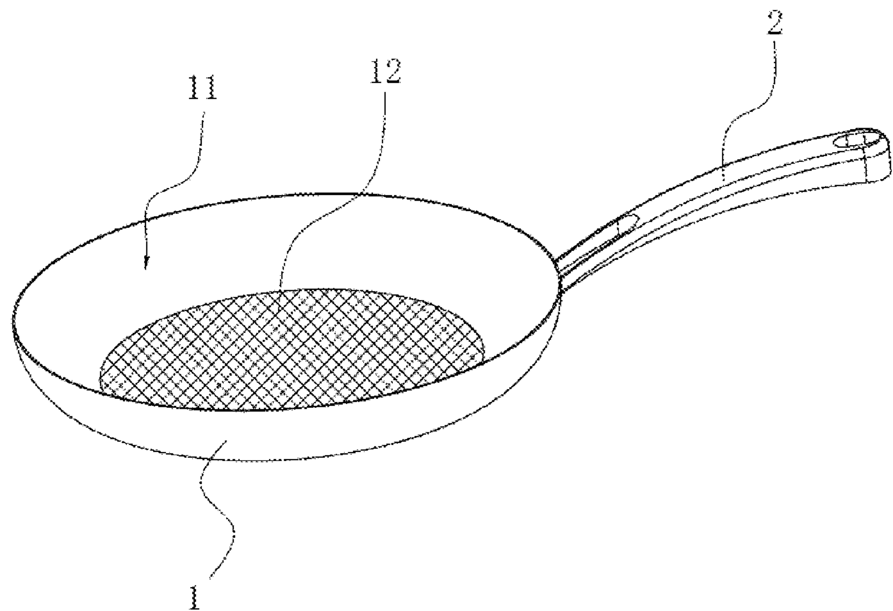
FIG. 1 is a schematic view of an appearance structure of a cooking utensil according to the present application.

Listing of reference signs: 1. body; 11. inner surface; 12. cooking area; 2. handle; 3. edible oil; 4. protrusion; 4.1. first protrusion; 4.2. second protrusion; 41. gap; a. contact angle.

DETAILED DESCRIPTION

In order to make a purpose, a technical solution, and an advantage of the present application more clearly, the following will be further described in detail below with reference to drawings. Components of the embodiments of the present application described and illustrated in the drawings can be arranged and designed in various different configurations. Based on the embodiments of the present application, all other embodiments obtained by ordinary skilled in the art without creative labor are within a scope of protection of the present application.

It should be noted that similar labels and letters represent similar items in the following figures, therefore, once an item is defined in one figure, it does not need to be further defined or explained in subsequent figures.

In the description of the present application, it should be noted that unless otherwise specified and limited, terms “install”, “connected”, and “connection” should be broadly understood, for example, it can be a fixed connection, a detachable connection, or an integral connection; it can be a mechanical connection or an electrical connection; it can be directly connected, indirectly connected through an intermediate medium, or connected internally between two components. For ordinary skilled in the art, specific meanings of the above terms in the present application can be understood in specific situations.

In the description of the present application, it should be understood that terms “up”, “down”, “left”, “right” and so on indicate an orientation or positional relationship based on the orientation or positional relationship shown in the accompanying drawings, which is only for a convenience of describing the present application and simplifying the description, rather than indicating or implying that the device or component referred to must have a specific orientation, be constructed and operated in a specific orientation, therefore, it cannot be understood as a limitation to the present application.

A detailed explanation of the embodiments of the present application will be provided in conjunction with the drawings below. In non-conflicting situations, the features in the following Examples can be combined with each other.

Example 1

Figure 2:
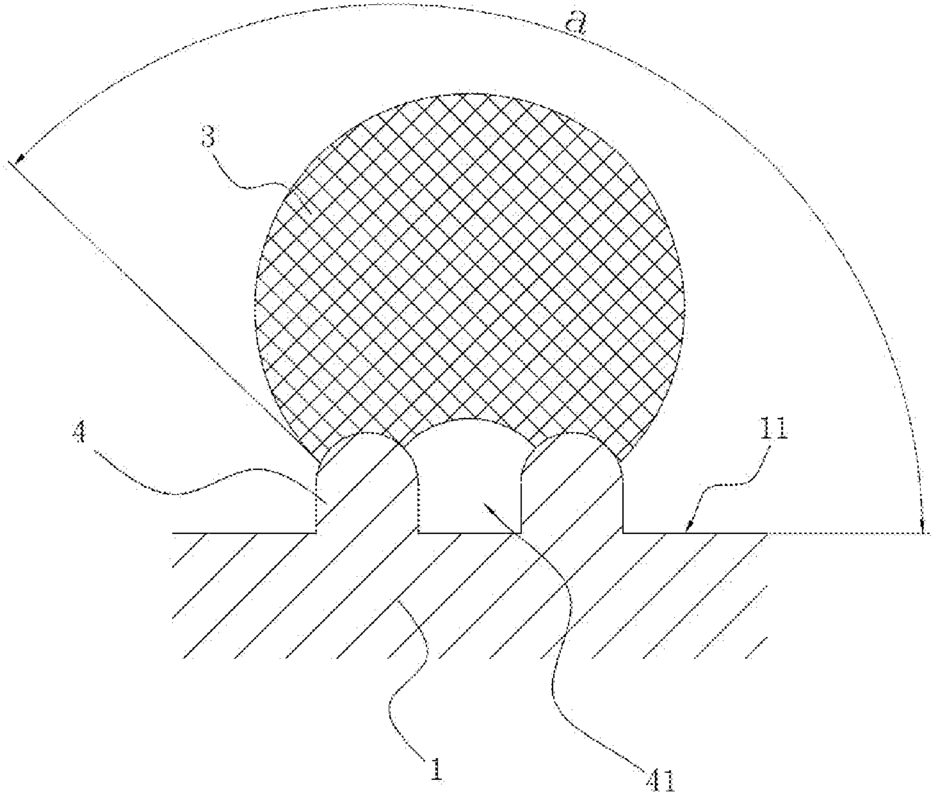
FIG. 2 is a schematic cross-sectional view of the cooking utensil according to a first Example of the present application.
Figure 3:
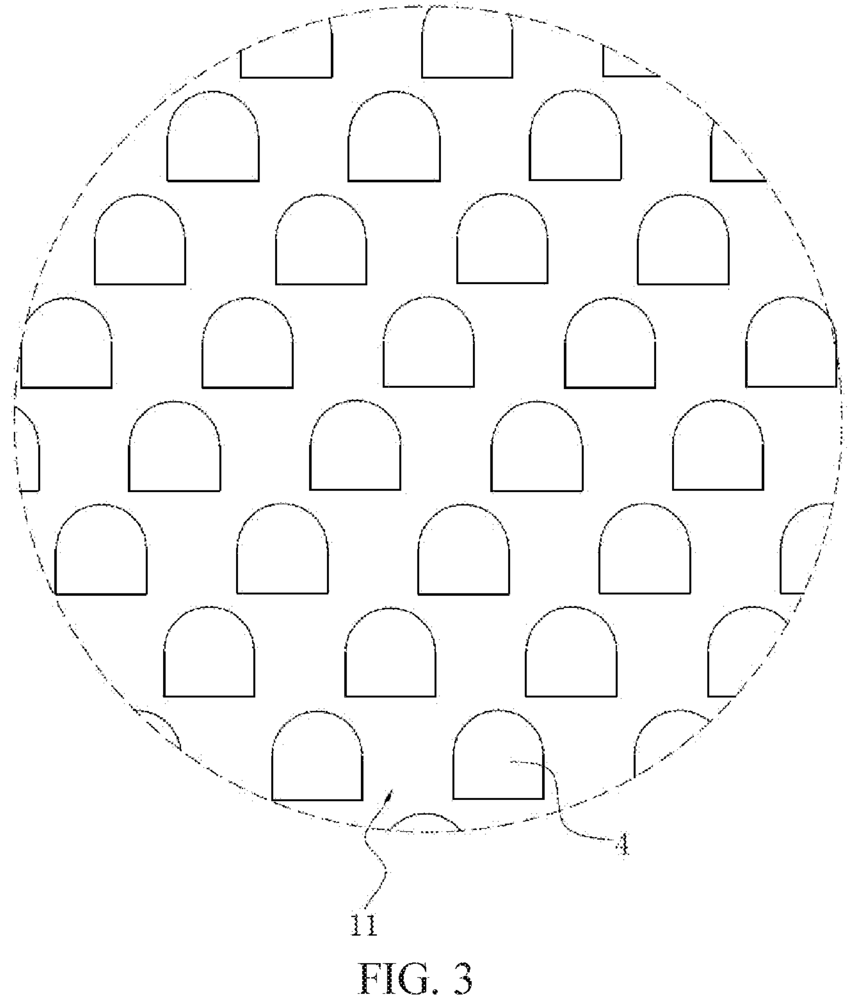
FIG. 3 is a 45 degree oblique view schematic view according to the first Example of the present application.

Referring to FIGS. 1-3, a cooking utensil is disclosed, taking a frying pan as an example, the frying pan includes a body 1 and a handle 2, an interior of body 1 has an inner surface 11, and an area near a bottom of the frying pan is a cooking area 12, protrusions 4 in the present application are distributed in a certain array to cover at least the cooking area 12, in order to achieve non-stick performance of an entire inner surface 11 of the cooking utensil, the protrusions 4 can be arranged regularly on the inner surface 11. The protrusions 4 can be etched onto the inner surface 11 using laser pulses, or the protrusions 4 can be formed by chemical etching or stamping to make the protrusions 4 higher than the inner surface 11, and gaps 41 between the protrusions 4 are communicated with each other to allow gas or liquid to flow along the inner surface 11 within the gaps 41.

In order to increase hardness of a surface of a protrusion and prevent discoloration of the cooking utensil at high temperatures, a physical vapor deposition layer is provided on an inner surface of the cooking utensil, the physical vapor deposition layer is a PVD coating formed by depositing a PVD target material composed of 10-30% silicon and a balance of metal onto the surface of the protrusions through PVD process, the metal includes one or more selected from a group consisting of chromium, zirconium or titanium.

The PVD target material of Example 1 is composed of 15% silicon by mass percentage and a balance of chromium. A PVD process included the following steps:

- Step 1: the body 1 of the cooking utensil with a surface roughness Ra of 0.5 and the PVD target material was installed in a deposition chamber so that a distance between the body land the PVD target material was 50 cm; the deposition chamber was vacuumed to $4.5\times10^{-3}$ Pa, then gradually heated a temperature of the deposition chamber from 25° C. to 355° C. within 30 minutes; subsequently, the deposition chamber was vacuumed to $2.5\times10^{-3}$ Pa and a glow discharge plasma surface cleaning treatment was performed in Ar for 25 minutes under a bias voltage of −800V, the PVD target material was composed of 15% silicon by mass percentage and the balance of chromium;
- Step 2: an etching-process was performed for 10 minutes under an Ar-pressure of $2.5\times10^{-3}$ Pa and a pulsed bias voltage of −600V (with an 80% duty cycle and a frequency of 80 kHz); and Step 3: Preparation of PVD coating by reaction in pure $N_2$ atmosphere: during a deposition process, $N_2$ was first introduced, the pressure inside the deposition chamber was adjusted to $3.0\times10^{-3}$ Pa, while a magnetron sputtering power supply was turned on to deposit a PVD coating with a thickness of 1.51 μm on the body 1 of the cooking utensil.

Referring to FIG. 2, a vertical section of an end face of each of the protrusions 4 in Example 1 is semi-circular, and a diameter of each of the protrusions 4 is 0.15-0.5 millimeters, with an optimal value of 0.3 millimeters; the closest distance between any two protrusions 4 is 0.2-0.6 millimeters, with an optimal distance of 0.3 millimeters; a height of each of the protrusions 4 is 0.05-0.1 millimeters, with an optimal value of 0.07 millimeters.

An end face of each of the protrusions 4 departing from the inner surface 11 in Example 1 is a curved surface, specifically a hemispherical surface. The cross-section of each of the protrusion 4 in Example 1 can also be designed as a polygon, such as a rectangle, a pentagon, a hexagon, etc., or as an irregular surface formed by a combination of the curved surface and a flat surface.

During a cooking process, when edible oil 3 drips onto the inner surface 11 of the frying pan, edible oil 3 comes into contact with the protrusions 4. Under a tension of edible oil 3 itself, a contact angle a is formed at an edge of each of the protrusions 4, which is greater than or equal to 80°. Testing non-stick performance through computer simulation and cooking, a range of the contact angle a from 90° to 130° has better non-stick performance, this angle range is easy to achieve in processing and has a relatively low manufacturing cost, an optimal contact angle a is 110°.

Due to gaps 41 that are communicated with each other are formed between the protrusions 4, the air in the gaps 41 creates an air cushion effect, edible oil 3 or cooking ingredients have-a-lower chance of direct contact with the inner surface 11, thereby improving non-stick performance of the frying pan. A non-stick structure which is formed by the protrusions 4 in the present application has a certain non-stick effect on the frying pan even without adding edible oil 3 during cooking, and the non-stick effect is even better when adding edible oil 3.

The non-stick structure of a traditional frying pan is formed by processing a plurality of closed pits on an inner surface of the traditional frying pan, and convex ribs are formed around the pits to prevent the pits from communicating, a function of the pits is to store edible oil 3 in the pits, so that edible oil 3 can be distributed more evenly at a bottom of the traditional frying pan, and the cooking ingredients can come into better contact with edible oil 3, thereby achieving non-stick cooking. This structure has a large area of convex ribs, which affects its non-stick performance, a consistency of non-stick performance is poor, and it is difficult to clean the pits inside.

The technical solution of the present application is to process the protrusions 4 on the inner surface 11 of the frying pan that are higher than the inner surface 11, the gaps 41 between the protrusions 4 are communicated with each other, which not only facilitates a flow of air and edible oil 3 in the gaps 41 to achieve non-stick performance, but also has better heat transfer performance to make heat in the cooking area 12 more uniform to achieve non-stick performance. In addition, due to the gaps 41 are communicated with each other, the non-stick structure of the protrusions 4 also facilitates cleaning of substances inside the gaps 41 by brushes or water.

Referring to FIG. 3, In Example 1, the protrusions 4 are evenly distributed and can further be designed as a "米" shaped or arranged in a structure with a plurality of circular rings that are nested within each other according to different needs.

Example 2

Figure 4:
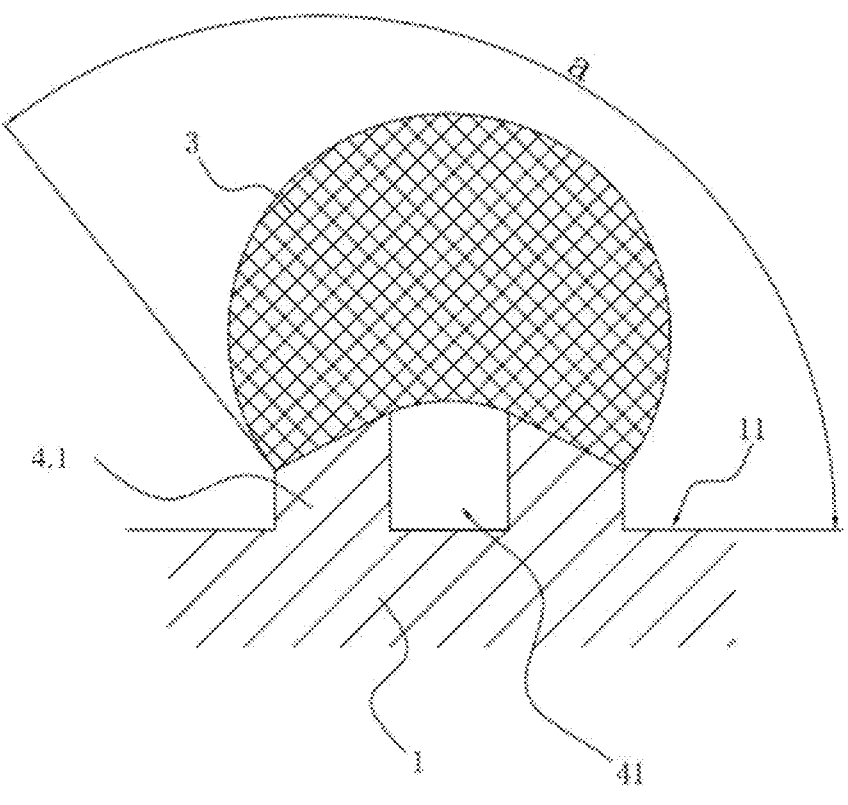
FIG. 4 is a schematic cross-sectional view of the cooking utensil according to a second Example of the present application.
Figure 5:
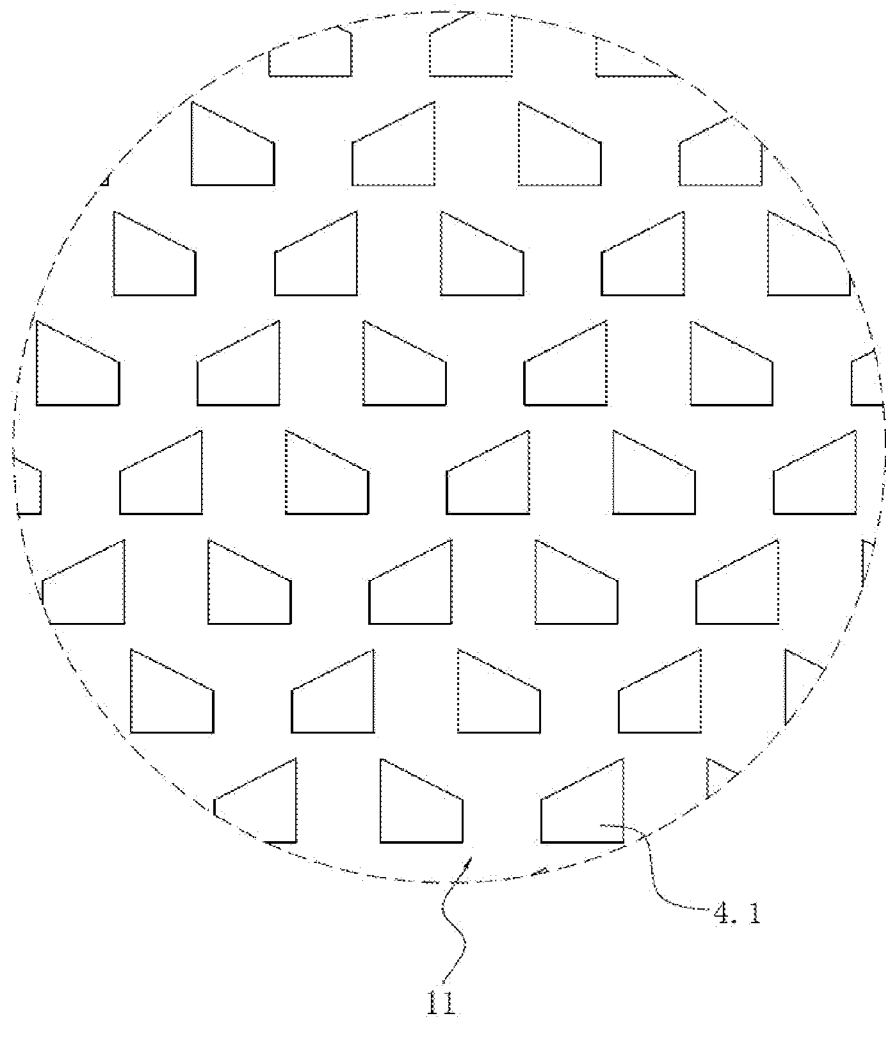
FIG. 5 is a 45 degree oblique view schematic view according to the second Example of the present application.

Referring to FIGS. 4 and 5, a difference between Example 2 and Example 1 is that an end face of each of first protrusions 4.1 departing from the inner surface 11 of the body 1 is a flat surface, which can be the flat surface parallel to the inner surface 11 or designed as an inclined surface relative to the inner surface 11.

Example 2 takes an example where end faces of adjacent first protrusions 4.1 are all inclined surfaces. The end faces of two first protrusions 4.1 are inclined in opposite directions, and an angle which is relatively distant between the end faces of the two first protrusions 4.1 and side walls of the first protrusions 4.1 is an obtuse angle. Graphics obtained through computer simulation show that, due to a surface tension of edible oil 3, there is the contact angle a between edible oil 3 and an outer side of each of the first protrusions 4.1, there is no edible oil 3 in the gaps 41, and the air in the gaps 41 acts as the cushion effect to reduce a contact area between the cooking utensil and edible oil 3 or cooking ingredients, thereby improving non-stick performance.

Referring to FIG. 5, an opposite arrangement of the inclined surfaces on the end faces of two adjacent first protrusions 4.1.

Example 3

Figure 6:
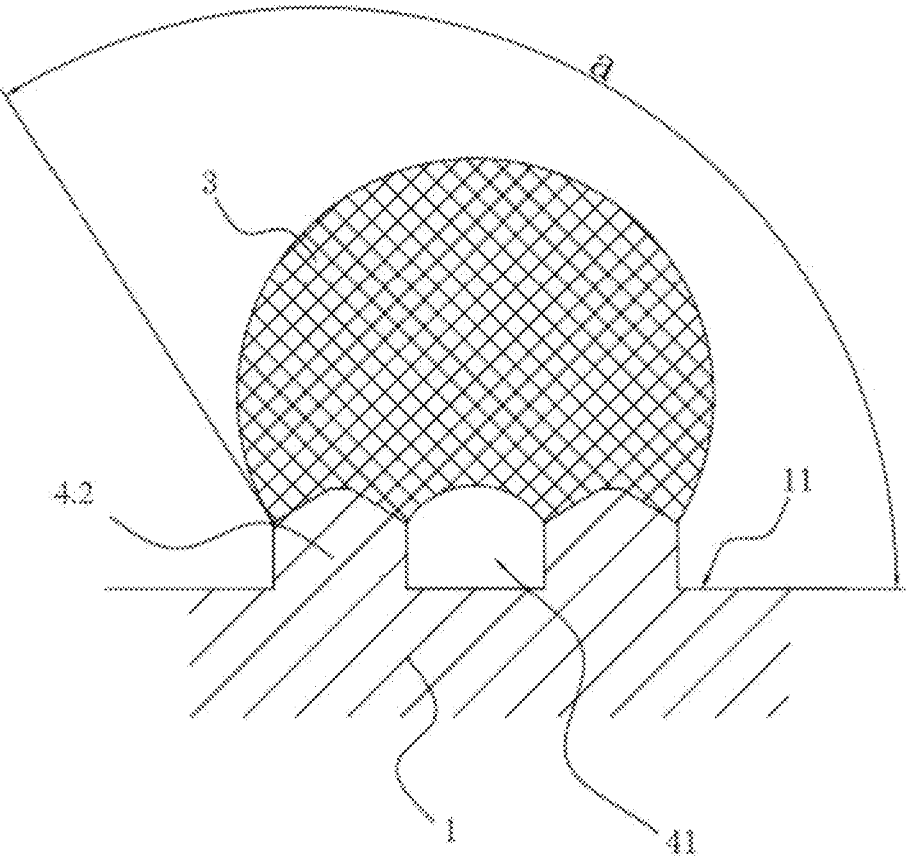
FIG. 6 is a schematic cross-sectional view of the cooking utensil according to a third Example of the present application.
Figure 7:
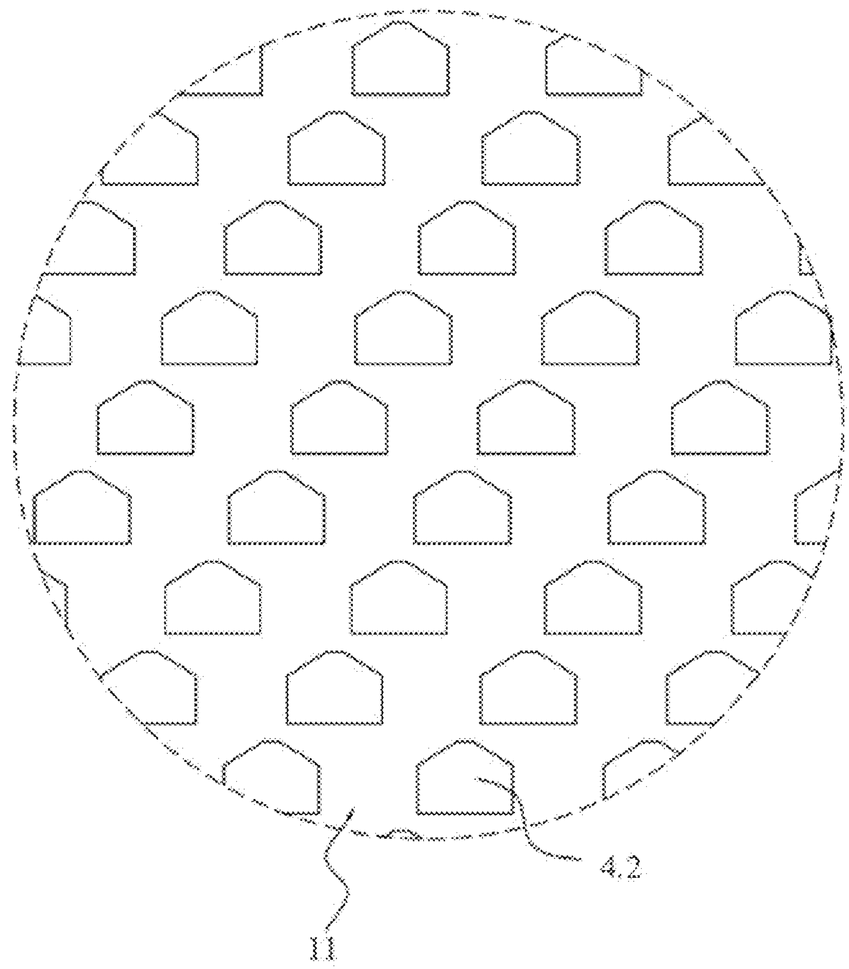
FIG. 7 is a 45 degree oblique view schematic view according to the third Example of the present application.

Referring to FIGS. 6 and 7, a difference between Example 3 and Example 1 is that a longitudinal section of each of second protrusions 4.2 is a polygon, and an angle between the end face of each of the second protrusions 4.2 and the side wall of each of the second protrusions 4.2 is the obtuse angle. This structure has better strength and safety compared to Example 2, which does not have sharp edges.

Example 4

Figure 8:
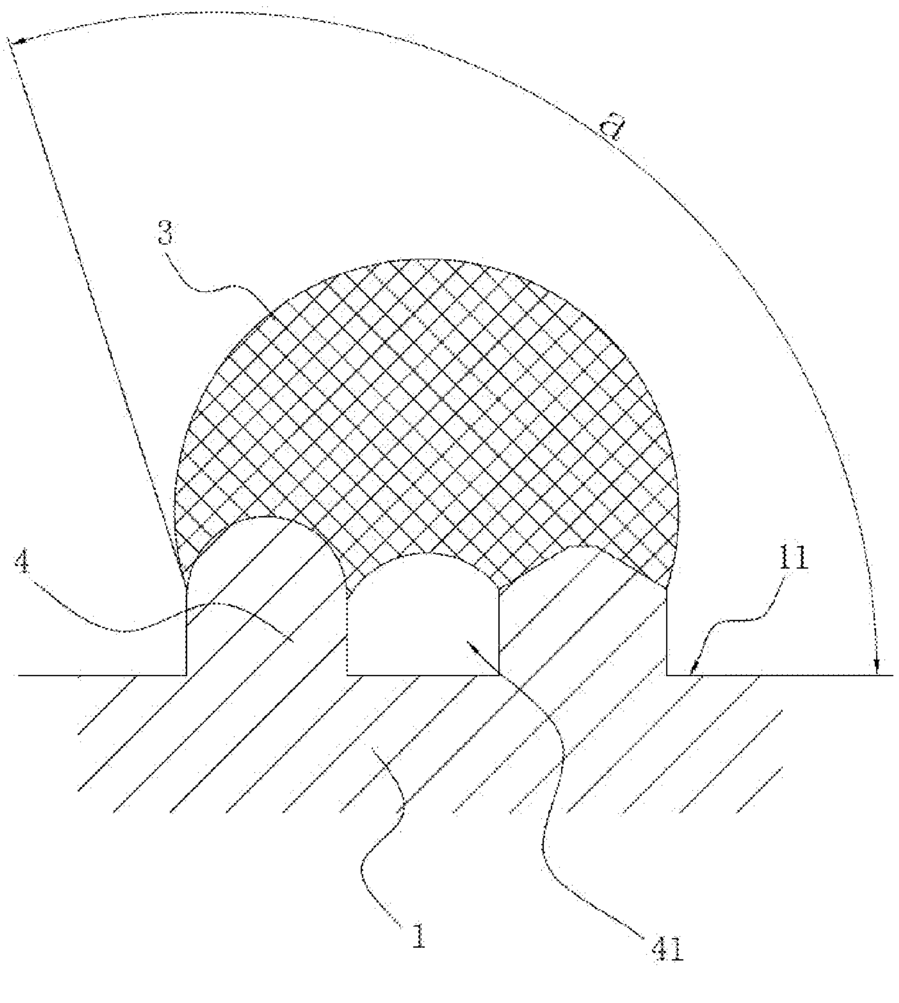
FIG. 8 is a schematic cross-sectional view of the cooking utensil according to a fourth Example of the present application.
Figure 9:
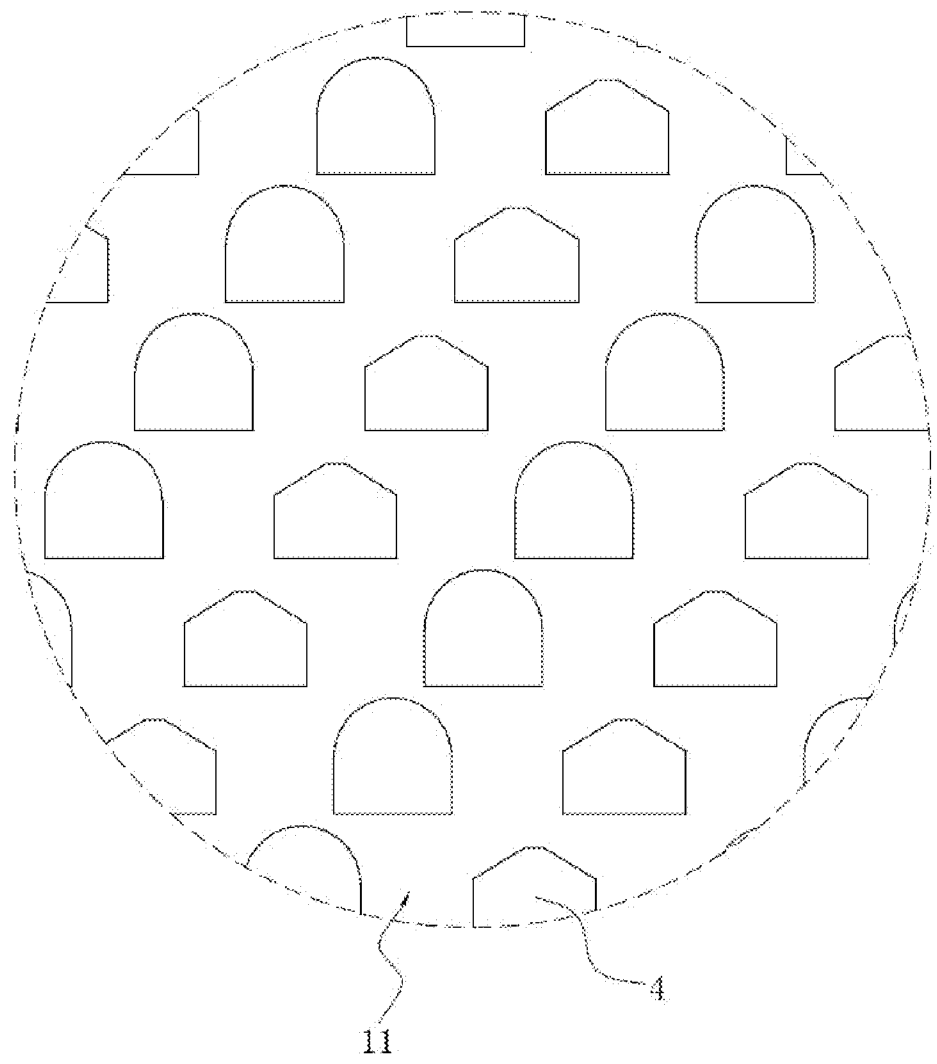
FIG. 9 is a 45 degree oblique view schematic view according to the fourth Example of the present application.

Referring to FIGS. 8 and 9, a difference between Example 4 and Example 1 is that structures of the end faces of each of the protrusions 4 and each of the second protrusions 4.2 are different, each of the protrusions 4 is adjacent to each of the second protrusions 4.2, the structures of the end faces of each of the protrusions 4 and each of the second protrusions 4.2 in Example 4 are different, which is a staggered arrangement of spherical protrusions in Example 1 and polygonal protrusions in Example 3.

Example 5

Figure 10:
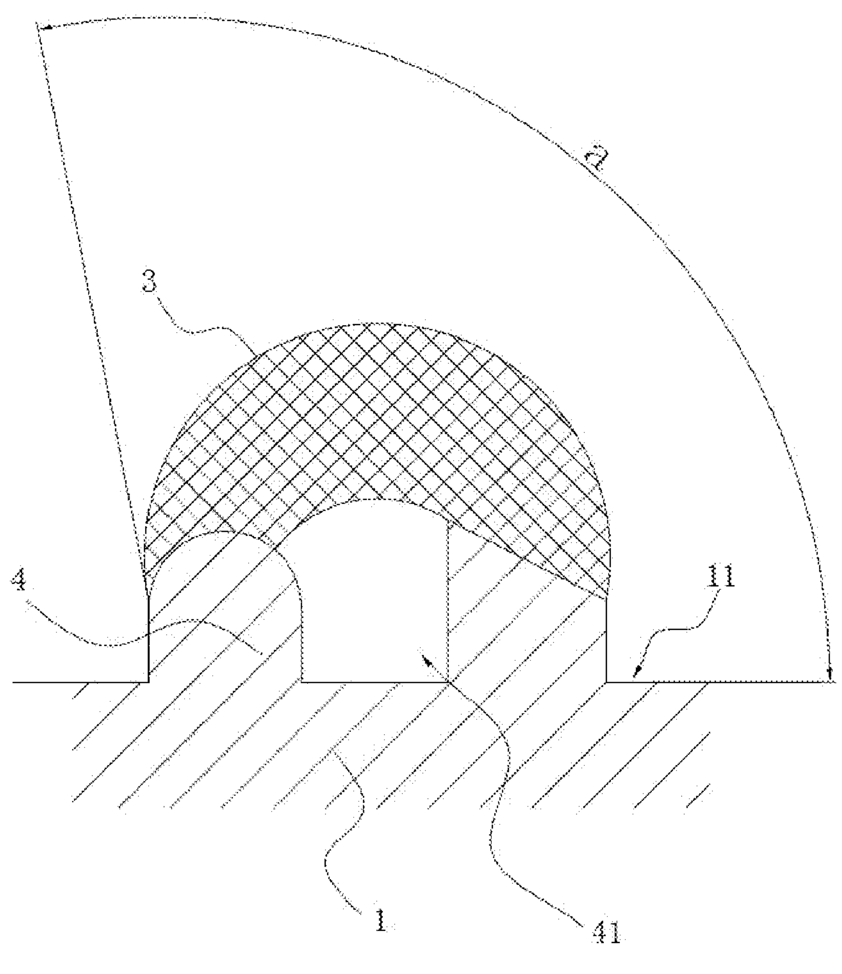
FIG. 10 is a schematic cross-sectional view of the cooking utensil according to a fifth Example of the present application.
Figure 11:
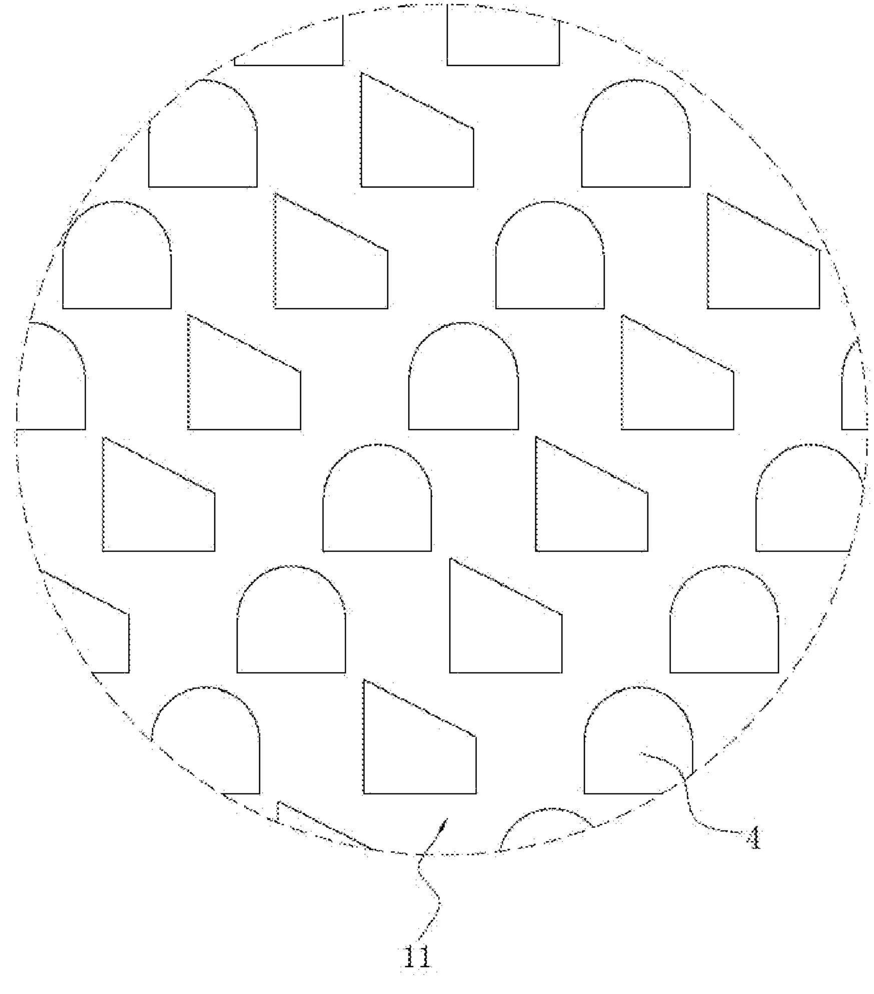
FIG. 11 is a 45 degree oblique view schematic view according to the fifth Example of the present application.

Referring to FIGS. 10 and 11, a difference between Example 5 and Example 1 is that structures of the end faces of each of the protrusions 4 and each of the first protrusions 4.1 are different, each of the protrusions 4 is adjacent to each of the first protrusions 4.1, the structures of the end faces of each of the protrusions 4 and each of the first protrusions 4.1 in Example 5 are different, which is a staggered arrangement of spherical protrusions in Example 1 and inclined protrusions in Example 2.

Example 6

Figure 12:
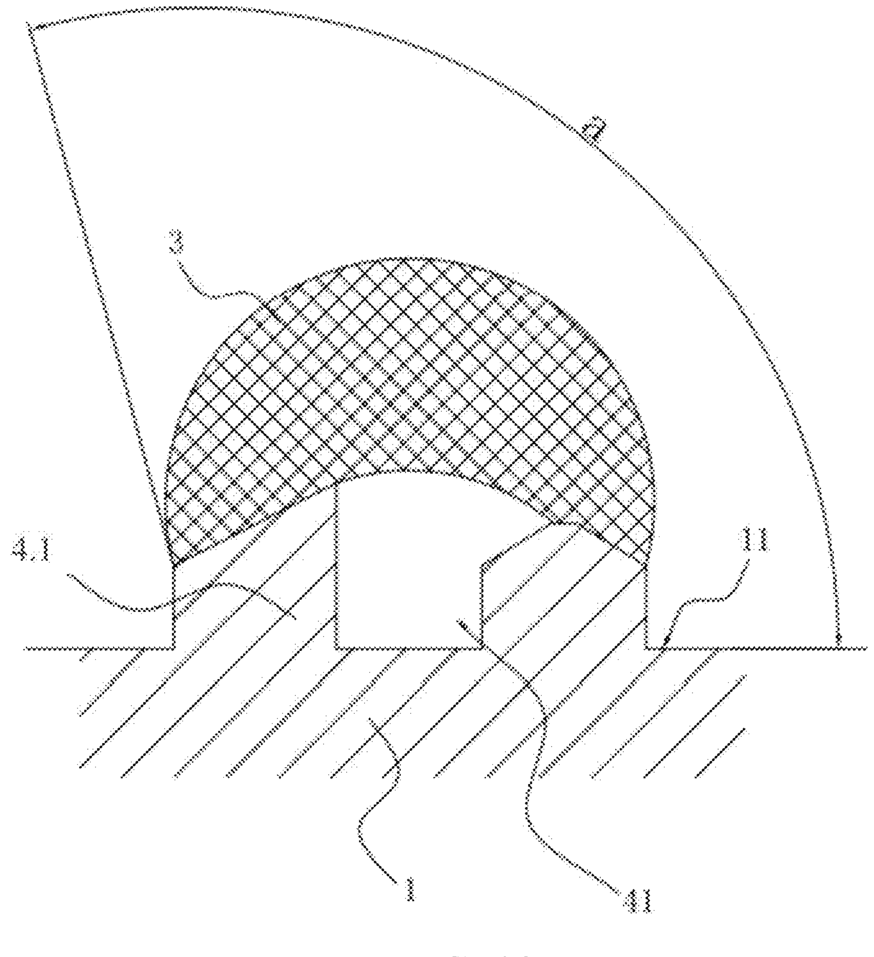
FIG. 12 is a schematic cross-sectional view of the cooking utensil according to a sixth Example of the present application.
Figure 13:
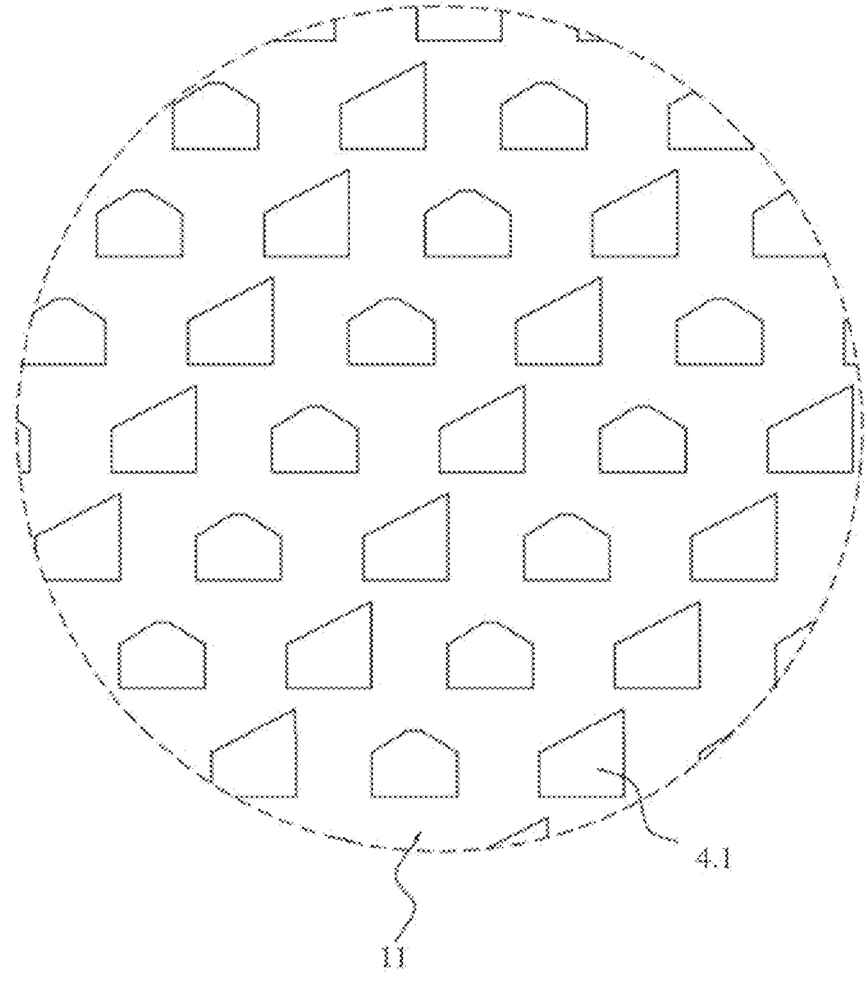
FIG. 13 is a 45 degree oblique view schematic view according to the sixth Example of the present application.

Referring to FIGS. 12 and 13, a difference between Example 6 and Example 1 is that structures of the end faces of each of the first protrusions 4.1 and each of the second protrusions 4.2 are different, each of the first protrusions 4.1 is adjacent to each of the second protrusions 4.2, the structures of the end faces of each of the first protrusions 4.1 and each of the second protrusions 4.2 in Example 6 are different, which is a staggered arrangement of inclined protrusions in Example 2 and polygonal protrusions in Example 3.

The following table shows results of computer simulation and actual cooking non-stick performance test of technical solutions for different Examples, the computer simulation was set soybean oil at 20° C., and the non-stick performance test was conducted in accordance with national standard GB/T 32095.2-2015 "Performance and test methods of non-stick surface of domestic metal cooking utensils for household food—Part 2: Test specification of non-stick performance and abrasion resistance".

| 20° C. soybean oil | | | | |
|---|---|---|---|---|
| parameter | | | | |
| density (kg/L) | viscosity (cps) | surface tension (n/m) | droplet diameter (mm) | plane contact angle (°) |
| 0.92 | 57.1 | 0.025 | 3 | 75 |

| solution | diameter-space-height (mm) | contact angle a (°) | spreading diameter (mm) | spreading area ($mm^2$) | non-stick performance (national standard grade) |
|---|---|---|---|---|---|
| Example 1 | 0.2-0.2-0.10 | 136 | 0.52 | 1.01 | national standard level I |
| Example 1 | 0.2-0.3-0.10 | 130 | 0.53 | 1.03 | national standard level I |
| Example 1 | 0.4-0.3-0.08 | 131 | 0.55 | 1.04 | national standard level I |
| Example 1 | 0.3-0.3-0.07 | 129 | 0.57 | 1.06 | national standard level I |
| Example 2 (end face is a flat surface) | 0.2-0.2-0.10 | 80 | 1.36 | 5.81 | National standard level II |
| Example 2 (end face isan inclined surface) | 0.2-0.2-0.10 | 128 | 0.59 | 1.09 | national standard level I |
| Example 3 | 0.2-0.2-0.10 | 122 | 0.60 | 1.13 | national standard level I |
| Example 4 | 0.2-0.2-0.10 | 108 | 0.68 | 1.21 | national standard level I |
| Example 5 | 0.2-0.2-0.10 | 101 | 0.66 | 1.18 | National standard level II |
| Example 6 | 0.2-0.2-0.10 | 105 | 0.71 | 1.25 | national standard level I |

Based on the above simulation and experimental data, it can be seen that all technical solutions of embodiments can achieve good non-stick effects, the technical solution of Example 1 can achieve a larger contact angle and the best non-stick performance.

Example 7

A difference between Example 7 and Example 1 is that in Example 1 "the PVD target material is composed of 15% silicon by mass percentage and a balance of chromium" is replaced with "the PVD target material is composed of 20% silicon by mass percentage and a balance of chromium".

Example 8

A difference between Example 8 and Example 1 is that in Example 1 "the PVD target material is composed of 15% silicon by mass percentage and a balance of chromium" is replaced with "the PVD target material is composed of 15% silicon by mass percentage, 82% chromium by mass percentage, and 3% titanium by mass percentage".

Example 9

A difference between Example 9 and Example 1 is that in Example 1 "the PVD target material is composed of 15% silicon by mass percentage and a balance of chromium" is replaced with "the PVD target material is composed of 15% silicon by mass percentage, 84.9% chromium by mass percentage, and 0.1% titanium by mass percentage".

Example 10

A difference between Example 9 and Example 1 is that in Example 1 "the PVD target material is composed of 15% silicon by mass percentage and a balance of chromium" is replaced with "the PVD target material is composed of 15% silicon by mass percentage, 41% chromium by mass percentage, 41% zirconium by mass percentage, and 3% titanium by mass percentage".

Comparative Example 1

A difference between Comparative example 1 and Example 1 is that in Example 1 "the PVD target material is composed of 15-20% silicon by mass percentage and a balance of chromium" is replaced with "the PVD target material is composed of 15% silicon by mass percentage, 80% chromium by mass percentage, and 5% titanium by mass percentage".

Comparative Example 2

A difference between Comparative example 2 and Example 1 is that in Example 1 "the PVD target material is composed of 15% silicon by mass percentage and a balance of chromium" is replaced with "the PVD target material is a commercially available PVD target material".

Performance Testing Experiment

Bodies of cooking utensils with PVD coating in Examples 1, 7-10, and Comparative examples 1-2 were subjected to high-temperature treatment, the bodies of cooking utensils with PVD coating in Examples 1, 7-10, and Comparative examples 1-2 were placed in environments of 250° C., 300° C., 350° C., and 400° C., respectively, and left to stand for half an hour to observe discoloration. Results are shown in Table 1

TABLE 1

Discoloration of Examples 1, 7-10, and Comparative Examples 1-2

| Project | Example 1 | Example 7 | Example 8 | Example 9 | Example 10 | Comparative Example 1 | Comparative Example 2 |
|---|---|---|---|---|---|---|---|
| 250° C. | No discoloration occurred | No discoloration occurred | No discoloration occurred | No discoloration occurred | No discoloration occurred | No discoloration occurred | Discoloration occurs, with a grayish black color |
| 300° C. | No discoloration occurred | No discoloration occurred | No discoloration occurred | No discoloration occurred | No discoloration occurred | No discoloration occurred | Discoloration occurs, with a grayish black color |
| 350° C. | No discoloration occurred | No discoloration occurred | No discoloration occurred | No discoloration occurred | No discoloration occurred | No discoloration occurred | Discoloration occurs, with a grayish black color |
| 400° C. | No discoloration occurred | No discoloration occurred | No discoloration occurred | No discoloration occurred | No discoloration occurred | No discoloration occurred | Discoloration occurs, with a grayish black color |

The cooking utensils with PVD coating in Examples 1, 7-10, and Comparative Examples 1-2 were soaked in oil stains and then cleaned. Cleaning results are shown in Table 2.

TABLE 2

Cleaning results of Examples 1, 7-10, and Comparative Examples 1-2

| Project | Example 1 | Example 7 | Example 8 | Example 9 | Example 10 | Comparative Example 1 | Comparative Example 2 |
|---|---|---|---|---|---|---|---|
| Surface condition after oil stain cleaning | No oil stains | No oil stains | No oil stains | No oil stains | No oil stains | No oil stains | Presence of oil stains |

Hardness tests were conducted on the bodies of cooking utensils with PVD coating in Examples 1, 7-10, and Comparative examples 1-2 based on GB/T4342-1991 "Metallic materials-Vickers microhardness test". Hardness test results are shown in Table 3.

TABLE 3

Hardness test results of Examples 1, 7-10, and Comparative Examples 1-2

| Project | Example 1 | Example 7 | Example 8 | Example 9 | Example 10 | Comparative Example 1 | Comparative Example 2 |
|---|---|---|---|---|---|---|---|
| hardness/HV | 1550 | 1570 | 1630 | 1640 | 1680 | 1440 | 1150 |

A non-stick performance test was conducted on the bodies of the cooking utensils with PVD coating in Examples 1, 7-10, and Comparative Examples 1-2, a testing method is as follows: a) an appropriate amount of vegetable oil was poured into the body of the cooking utensil and the non-stick surface was wiped with a soft cloth until the vegetable oil was evenly coated; b) the non-stick surface was cleaned with warm water above 60° C. and a neutral detergent, then rinsed with clean water and dried; c) the cooking utensil was placed on an electric stove with a rated voltage of 220 V and an output power of 1 kW, then heated, and a surface temperature was measured with a surface thermometer with an accuracy of not less than 2.5, when the surface temperature of the PVD coating reached 150° C.-170° C., a shell of a fresh egg that meets requirements of SB/T 10277-1997 level 2 (weight between 50 g and 60 g) was broken and placed the fresh egg in the cooking utensil until egg white was basically solidified (the surface temperature of the PVD coating should not exceed 210° C. throughout this cooking process); d) a plastic spatula with an edge thickness of 0.2 mm-0.5 mm was used to completely take out the egg. If any egg residue attached, gently wiped it off with a damp sponge or gauze; repeated steps c) and d) three times and observed. Results are shown in Table 4.

TABLE 4

Non-stick performance test results of Examples 1, 7-10, and Comparative Examples 1-2

| Project | Example 1 | Example 7 | Example 8 | Example 9 | Example 10 | Comparative Example 1 | Comparative Example 2 |
|---|---|---|---|---|---|---|---|
| Non-stick effect | Grade I | Grade I | Grade I | Grade I | Grade I | Grade I | Grade II |

Combining Examples 1, 7-10, as well as Comparative Examples 1-2 and Tables 1-4, it can be seen that an application of the PVD target material provided in the present application in cooking utensil can enhance surface hardness of metal substrates, the hardness of the PVD coating provided in the present application is more than 8 times that of ordinary steel materials, and the PVD target material provided in the present application can ensure that the PVD coating does not change color when heated, the PVD coating has good non-stick performance, a surface of the PVD coating is easy to clean, and shows no obvious oil residue after cleaning. Moreover, by limiting content of titanium, the present application can avoid a problem of cost not being proportional to an increase in hardness caused by an increase in titanium content.

Example 11

A difference between Example 11 and Example 1 is that in Example 1, "a thickness of 1.51 μm" is replaced with "a thickness of 2.4 μm".

Comparative Example 3

A difference between Comparative Example 3 and Comparative Example 2 is that in Comparative Example 2, "a surface roughness Ra of 0.5" is replaced with "a surface roughness Ra of 0.16".

Hardness tests were conducted on the bodies of cooking utensils with PVD coating in Example 11 and Comparative Example 3 based on GB/T4342-1991 "Metallic materials-Vickers microhardness test". Hardness test results are shown in Table 5.

TABLE 5

Hardness test results of Example 1, Example 11 and Comparative Example 3

| Project | Example 1 | Example 11 | Comparative Example 3 |
|---|---|---|---|
| hardness/HV | 1550 | 1555 | 1540 |

A non-stick performance test was conducted on the bodies of the cooking utensils with PVD coating in Example 1, Example 11 and Comparative example 3, a testing method is as follows: a) an appropriate amount of vegetable oil was poured into the body of the cooking utensil and the non-stick surface was wiped with a soft cloth until the vegetable oil was evenly coated; b) the non-stick surface was cleaned with warm water above 60° C. and a neutral detergent, then rinsed with clean water and dried; c) the cooking utensil was placed on an electric stove with a rated voltage of 220 V and an output power of 1 kW, then heated, and a surface temperature was measured with a surface thermometer with an accuracy of not less than 2.5, when the surface temperature of the PVD coating reached 150° C.-170° C., a shell of a fresh egg that meets requirements of SB/T 10277-1997 level 2 (weight between 50 g and 60 g) was broken and placed the fresh egg in the cooking utensil until egg white was basically solidified (the surface temperature of the PVD coating should not exceed 210° C. throughout this cooking process); d) a plastic spatula with an edge thickness of 0.2 mm-0.5 mm was used to completely take out the egg. If any egg residue attached, gently wiped it off with a damp sponge or gauze; repeated steps c and d three times and observed. Results are shown in Table 6.

TABLE 6

Non-stick performance test results of Example 1, Example 11 and Comparative Example 3

| Project | Example 1 | Example 11 | Comparative Example 3 |
|---|---|---|---|
| Non-stick effect | Grade I | Grade I | Grade II |

Combining Example 1 and Example 11, as well as Comparative Example 3 and Tables 5-6, it can be seen that the PVD coating formed by physical vapor deposition using the PVD target material provided in the present application have good hardness and non-stick performance on a metal surface with different surface roughness, and a thickness of deposited PVD coating does not affect its hardness and non-stick performance, however, commercially available PVD target materials cannot form the PVD coating with non-stick performance on the metal surface. This is because an existing PVD target material can only ensure an overall non-stick performance through an original concave convex structure of substrates after forming PVD coating, when a substrate surface does not have concave convex structure, the PVD coating formed by the existing PVD target material cannot ensure the overall non-stick performance, however, the PVD target material provided in the present application does not require the substrate surface to have the concave convex structure, on smooth metal surfaces, a structurally dense PVD coating can be formed to ensure non-stick performance.

The above displays and describes basic principles, main features, and advantages of the present application. Those skilled in the art should understand that the present application is not limited by the above Examples, and the above Examples and the description only illustrate the principles of the present application. Without departing from the spirit and scope of the present application, the present application may undergo various changes, modifications, substitutions, and variations, all of which fall within the scope of the claimed application.

What is claimed is:

1. A cooking utensil comprising a body, wherein a plurality of protrusions are integrally formed on at least a partial area of an inner surface of the body, the plurality of protrusions are higher than the inner surface, gaps between the plurality of protrusions are in communication with each other to allow gas or liquid to flow along the inner surface within the gaps, and a physical vapor deposition layer is provided on a surface of each of the plurality of protrusions, wherein a cross-section of each of the plurality of protrusions is a circle, wherein:

a diameter of each of the plurality of protrusions is 0.15-0.5 mm, a distance between adjacent protrusions of the plurality of protrusions is 0.2-0.6 mm, and a height of each of the plurality of protrusions is 0.05-0.1 mm, wherein after each of the plurality of protrusions contacts with edible oil, there is a contact angle between the edible oil and each of the plurality of protrusions, and the contact angle is greater than or equal to 80°, and wherein the physical vapor deposition layer is a physical vapor deposition (PVD) coating formed by depositing a PVD target material on the surface of each of the plurality of protrusions through a PVD process, and the PVD target material is composed of 15-20% silicon by mass percentage and a balance of metal, the metal is chromium and titanium, and a content of the titanium is 0.001-3 wt % based on a total weight of the metal.

2. The cooking utensil according to claim 1, wherein the contact angle ranges from 90° to 136°.

3. The cooking utensil according to claim 1, wherein an end face of each of the plurality of protrusions distal from the inner surface of the body is a curved surface or an inclined surface.

* * * * *